US012785030B2

(12) United States Patent
Yesibolati et al.

(10) Patent No.: US 12,785,030 B2
(45) Date of Patent: Nov. 3, 2026

(54) TEMPERATURE CONTROL IN LIQUID PHASE TRANSMISSION ELECTRON MICROSCOPY

(71) Applicant: Danmarks Tekniske Universitet, Kongens Lyngby (DK)

(72) Inventors: Murat Nulati Yesibolati, Kongens Lyngby (DK); Kristian Mølhave, Kongens Lyngby (DK)

(73) Assignee: Danmarks Tekniske Universitet, Kongens Lyngby (DK)

( * ) Notice: Subject to any disclaimer, the term of this patent is extended or adjusted under 35 U.S.C. 154(b) by 358 days.

(21) Appl. No.: 18/574,091

(22) PCT Filed: Jun. 24, 2022

(86) PCT No.: PCT/EP2022/067421

§ 371 (c)(1),
(2) Date: Dec. 26, 2023

(87) PCT Pub. No.: WO2022/269073

PCT Pub. Date: Dec. 29, 2022

(65) Prior Publication Data

US 2024/0290573 A1 Aug. 29, 2024

(30) Foreign Application Priority Data

Jun. 25, 2021 (EP) .................................... 21181911

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/2001* (2013.01); *H01J 2237/2002* (2013.01)

(58) Field of Classification Search
CPC .. H01J 37/00; H01J 37/02; H01J 37/20; H01J 37/26; H01J 37/28; H01J 2237/2001;
(Continued)

(56) References Cited

U.S. PATENT DOCUMENTS 6,495,838 B1 12/2002 Yaguchi et al.
2013/0118367 A1 * 5/2013 Kennedy ................ B41F 19/00
101/35

(Continued)

FOREIGN PATENT DOCUMENTS

CN 110021512 A 7/2019
JP 2004022192 A 1/2004

(Continued)

OTHER PUBLICATIONS

WIPO/ISA/EPO, "International Search Report and Written Opinion" issued in PCT/EP2022/067421 on Oct. 17, 2022, 18 pages.

(Continued)

*Primary Examiner* — Jason L McCormack
(74) *Attorney, Agent, or Firm* — J. Peter Paredes; Amin Wasserman Gurnani LLP

(57) ABSTRACT

The present invention relates to a liquid phase transmission electron microscopy (LP-TEM) holder with integrated temperature regulation for operating with an associated transmission electron microscopy instrument providing an electron beam for imaging, the LP-TEM holder comprising a liquid phase sample receptacle (LPSR, 5) which may be made from two or more layers of materials. e.g. microchips, the LPSR providing a liquid compartment. The LP-TEM holder furthermore comprises an integrated temperature regulating unit (15), capable of regulating the temperature of the LPSR and liquid in the liquid compartment by means of a temperature measuring unit (16) capable of measuring a temperature in the liquid compartment. The LPSR is ther-
(Continued)

mally isolated with a thermal isolating portion (30), with respect to an external environment and associated devices. The invention is particularly advantageous for providing fast temperature regulation and accurate steady state temperatures of one or more fluids to be imaged.

16 Claims, 8 Drawing Sheets

(58) Field of Classification Search
CPC ....... H01J 2237/2002; H01J 2237/2003; H01J 2237/2065; H01J 2237/2802
USPC ................................ 250/306, 307, 310, 311
See application file for complete search history.

(56) References Cited

U.S. PATENT DOCUMENTS

| | | | |
|---|---|---|---|
| 2016/0276126 | A1 | 9/2016 | Zanderbergen |
| 2017/0062177 | A1 | 3/2017 | Walden, II et al. |
| 2017/0213692 | A1 * | 7/2017 | Yu .......................... G01N 23/02 |
| 2019/0080882 | A1 * | 3/2019 | Walden, II ....... G01N 23/20033 |
| 2020/0398271 | A1 | 12/2020 | Chen |

FOREIGN PATENT DOCUMENTS

| | | | |
|---|---|---|---|
| JP | 2013187096 | A | 9/2013 |
| WO | 2011/038062 | A2 | 3/2011 |

OTHER PUBLICATIONS

Chen, X. et al. "Recent developments of the in situ wet cell technology for transmission electron microscopies", Nanoscale, 2015,7, 4811-4819, Jan. 29, 2015.

Dillon, SJ et al. "Temperature Control in Liquid Cells for STM" In: "Liquid Cell Electron Microscopy", Nov. 24, 2016, Cambridge University Press, pp. 127-139.

N.N.: "Hummingbird ScientificLiquid TEM", Jan. 1, 2015, Retrieved from the Internet: URL: https:/hummingbirdscientific.com/wp-content/uploads/Liquid-Holder-WEB-Brochure.pdf.

Tai K et al. "In Situ Cryogenic Transmission Electron Microscopy for Characterizing the Evolution of Solidifying Water Ice in Colloidal Systems", Microsc. Microanal. 20, 330-337, 2014.

Creemer, JF et al. "An all-in-one nanoreactor for high-resolution microscopy on nanomaterials at high pressures", IEE 24th International Conference on Micro Electro Mechanical Systems (MEMS2011), IEEE, US, Jan. 23, 2011, pp. 1103-1106.

* cited by examiner

TEMPERATURE CONTROL IN LIQUID PHASE TRANSMISSION ELECTRON MICROSCOPY

CROSS-REFERENCE TO RELATED APPLICATIONS

The present application claims priority to PCT application serial no. PCT/EP2022/067421 filed Jun. 24, 2022, which claims priority to European patent application serial no. 21181911.5, filed Jun. 25, 2021, each herein incorporated by reference in their entireties.

FIELD OF THE INVENTION

The present invention relates to a transmission electron microscopy (TEM) holder, more specifically for liquid phase transmission electron microscopy (LP-TEM).

BACKGROUND OF THE INVENTION

Liquid phase transmission electron microscopy (LP-TEM, also abbreviated LTEM) offers atomic spatial resolution imaging with faster-than-video frame rate of complex processes in liquids.

When studying a sample dissolved in a liquid, as within an LP-TEM, the stability of temperature is critical and the rate of heating is a relevant parameter, so as to reach a target temperature within a relatively short timeframe, as well as reproducible drift during thermal expansion to enable tracking of the region of interest for imaging and performing calorimetry.

Current heating systems for LP-TEM sample holders are made in different ways, typically with microfabricated resistive heating elements incorporated on the microchips placed into the holders used for encapsulating the liquid samples. Such designs can suffer from requiring electrical contacts to the chips for this purpose, taking up the very limited space for such contacts hence hindering having other electrical measurement systems on the chips, such as electrochemical three-electrode measurements while controlling temperature. The systems ideally require individually calibrated chips for precise temperature measurements adding complexity and uncertainty in production and handling. Variable thermal contact between the chips and the holder may lead to unsteady temperature with varying heat dissipation to the holder and ensuing varying thermal drift may be an issue. The on-chip heaters may also be limited in the maximum power rating, leading to slow rates of heating and limited temperature range.

Some examples of on-chip heaters are:

Chinese patent application CN 110 021 512 A (to Univ. Beijing Technology) relates to an electro-thermal sample system for an in-situ liquid environment transmission electron microscope. The system comprises an airtight micro-sample table frame used for creating a liquid environment in a high-vacuum environment, a metal hollow sample rod frame, a liquid guide pipe, a lead wire, an airtight rubber ring arranged in the micro-sample table frame, an electrochemical detection/heating chip, wherein the liquid guide pipe and the lead wire are arranged in the sample rod frame. The electrochemical detection and heating chip is integrated on the micro-sample table, and is connected with an external circuit unit through the lead wire and an airtight connector, and is used for monitoring and detecting a current and a voltage in the liquid environment in the micro-sample. However, this thermal setup suffers from the disadvantageous on-chip heaters that require elaborate temperature calibration which can be difficult and complex to perform from one experiment to the next. Additionally, the needed wiring to the on-chip heater takes up precious space around the sample. Another example of an on-chip heating LP-TEM setup is disclosed in Japanese patent application JP 2013 187096 A (to Hitachi Ltd.).

US patent application 2017/213692 A1 (to Battelle Memorial Institute, USA) relates to another liquid sample imaging devices and processes for high resolution TEM imaging and multimodal analyses of liquid sample materials in-situ under high vacuum that are compatible with standard type TEM chip membranes and TEM sample holders allowing TEM liquid sample imaging to be performed wherever a TEM instrument is accessible, and at a substantially reduced cost compared to prior art systems and approaches. It is mentioned that heating from standard TEM equipment can be applied, but no specific details of such heating is mentioned.

OBJECT OF THE INVENTION

Reproducible high rate heating to quickly achieve a predefined temperature with a well-known drift is required to provide optimal imaging conditions. Removing the need for using the few available electrical contacts on the small chips for temperature control system will provide important features for e.g. electrochemical measurements while controlling temperature or calorimetry by on chip temperature sensors.

Hence, an improved LP-TEM sample holder with an improved temperature regulating unit would be advantageous, and in particular a more efficient and/or reliable and reproducible heating element would be advantageous.

It is a further object of the present invention to provide an alternative to the prior art.

In particular, it may be seen as an object of the present invention to provide a LP-TEM holder that solves the above mentioned problems of the prior art, while also providing LP-TEM technology for microscope detection capability with low electron flux under flow for samples and materials that are sensitive to the electron irradiation, such as in biochemical processes, as well as improved resolution and contrast by providing controlled sub 100 nm liquid layer thickness, e.g. by confining liquid in one or multiple micro- or nanochannels.

SUMMARY OF THE INVENTION

Thus, the above described objects and several other objects are intended to be obtained in a first aspect of the invention by providing a liquid phase transmission electron microscopy (LP-TEM) holder with integrated temperature regulation for operating with an associated transmission electron microscopy (TEM) instrument providing an electron beam for imaging, the LP-TEM holder comprising:

- a liquid phase sample receptacle (LPSR) comprising:
  - a liquid compartment for receiving an associated liquid sample for TEM imaging,
  - an upper and an lower TEM window, wherein the electron beam—during TEM imaging—enters the upper TEM window, propagates through said liquid sample, and exits the lower TEM window,
- a first part for mechanically fixating and supporting said LPSR during TEM imaging, the first part comprising an integrated temperature regulating unit, preferably a heat source, capable of regulating the temperature of the LPSR via thermal contact between said first part and said LPSR, a temperature measuring unit capable of measuring a temperature in said liquid compartment, and/or in said first part, and arranged for outputting a corresponding signal (S_T) indicative of the temperature (T_LC) in the liquid compartment, and a second part for physically supporting the first part relative to the transmission electron microscopy instrument, the second part further comprising thermal insulation for containing thermal energy from said integrated temperature regulating unit with respect to the LPSR, wherein the LPSR is arranged for being heated and/or cooled from said integrated temperature regulating unit in the first part during TEM imaging, and the temperature of the LPSR is controllable by adjusting the temperature regulation unit according to said signal S_T from the temperature measuring unit indicative of the temperature in the liquid compartment.

The present invention may be particularly advantageous for heating and/or cooling a sample quickly and with a high precision. In an embodiment of the invention, the temperature regulating unit may heat or cool a sample either at very low rates, such as at 0.01 K/minute, more preferably at 0.1 K/minute, to observe phase transitions at a specific temperature or having high temperature resolution, a well-defined low rate of e.g. 0.1 K per second for continuously imaging the evolution of a sample with temperature at relevant imaging resolution, at high rates, such as 50° C. per second, more preferably 10° C. per second, to rapidly reach a desired temperature, or at higher rates if wanted. The invention may furthermore be advantageous for maintaining a steady state temperature of +/−0.1° C., more preferably +/−0.01° C., of a sample during the imaging process.

The present invention may furthermore be particularly advantageous for image obtaining over a longer time span, in which the steady state temperature of the sample is critical, such as maintaining a steady state target temperature of a sample for such as 2 hours, 10 hours or even for days or weeks, such as for between 1 and 20 days to observe long time evolution in situ or ex situ, or such as for between 2 or 15 days.

In comparison with above mentioned Chinese patent application CN 110 021 512 A and other similar LP-TEM devices with on-chip resistive heating in close proximity with the liquid sample, the present invention differs in that a much more reproducible and stable temperature control is made possible. The temperature measuring unit of the present invention is not a part of the chip itself and provides a well calibrated temperature signal, not sensitive to any variations in chip fabrication or drift during use. Hence, the present invention is able to better maintaining a reproducible steady-state temperature over time and with respect to ramping up or down the temperature with well-controlled rates. The much improved temperature control resides in the fact that the relatively remote distance from the liquid sample in the LPSR relative to the temperature regulating unit, e.g. a heat source, requires that more or less that the entire first part—supporting the LPSR—will be heated to the desired temperature, or with the desired temperature rate. Considering also the typically microscopic dimensions of the liquid sample with the macroscopic dimensions of the first part and the temperature regulating unit of the present invention, it is therefore evident that the temperature control will be significantly improved. The somewhat remote location of the temperature regulating unit relative to the liquid sample is made possible amongst other factors by the normally high thermal conductivity of the first part, which may be made of suitable type of steel or similar material with relatively good thermal conductivity for use under vacuum conditions.

In the context of the present invention, a receptacle is to be understood as a device or mechanism configured to receive and hold or contain an object or fluid, such as a liquid sample.

In the context of the present invention, a transmission electron microscope is to be understood as a device, using a controlled beam of electrons to illuminate a specimen or liquid sample and produce/obtain a magnified image or a plurality of images, of said sample.

In the context of the present invention, the liquid compartment is to be understood a container or void suitable for either permanent containment of a liquid or for holding an amount of liquid which flows through said liquid compartment through at least one inlet, preferably a first inlet and a first outlet.

The liquid compartment may comprise a plurality of inlets and outlets depending on the desired flow configuration within the liquid compartment. In an embodiment of the invention, the liquid compartment is suitable for containing <1 μL of liquid, all depending on geometry, where a single nanochannel may contain <1 fL (femtoliter) while the full fluidic system of the holder may hold up to over 100 μL (microliter) in total, including volume of tubes for fluid connections within the holder. In some embodiments of the invention for optimum liquid phase TEM, the temperature of the liquid sample in the liquid compartment may be in the interval from −50 to 200 deg. Celsius, preferably in the interval from −25 to 150 deg. Celsius, more preferably in the interval from 0 to 100 deg. Celsius. In particular for studying liquid sample containing water under various pressures.

In the context of the present invention, integrated temperature regulation unit is to be understood as a built-in device for providing thermal energy, i.e. heating or cooling. The temperature regulation unit may be one or more of an electric resistive heater, an induction heater, a thermoelectric Peltier element, a condenser and evaporator or a combination of the aforementioned. In an embodiment of the invention, the integrated temperature regulating unit is configured so as to provide both heating and cooling as desired.

In the context of the present invention, temperature regulation is to be understood as regulating the temperature up, i.e. providing heat or regulating the temperature down, i.e. providing cooling. Furthermore, the regulation of temperature is to be understood as maintaining a desired temperature or rate of temperature change within the LPSR and/or within the sample/imaging region which are to be examined by the TEM. In an embodiment of the invention, a user may be imaging the sample in a first step, regulate the temperature, e.g. heating the sample, in a second step, acquiring one or more images of the sample in a third step, regulate the temperature, e.g. cooling the sample, in a fourth step and acquiring images of said cooled sample in a fifth step. In yet another embodiment of the invention, the first to fifth step may be reversed or may comprise further heating and/or cooling steps, so as to acquire images of the sample during a plurality of temperatures.

In the context of the present invention, a temperature measuring unit is to be understood as a device for either directly or remotely measuring/sensing a temperature of the of sample, such as by directly measuring the temperature of said sample or by measuring the temperature of the liquid compartment or by measuring the temperature of the first part which contains/holds said liquid compartment. The temperature measuring unit may be selected from one of: an infrared thermometer, a thermocouple, a thermistor, a resistance temperature detector, a pyrometer or other type of thermal sensor.

In the context of the present invention, thermal insulation is to be understood as the reduction or elimination of heat transfer, i.e. by providing a gap or void in which thermal conduction and/or thermal radiation is low, such as by interposing a region of material with low thermal conductivity.

In a preferred embodiment of the invention, the second part is thermally insulated so as to contain thermal energy from said integrated temperature regulating unit with respect to the LPSR, by limiting heat flow to the third part, the base, of the LP-TEM holder.

In a preferred embodiments, the integrated temperature regulating unit may comprises one or more of:

a heating element wherein said integrated temperature regulating unit is configured as a heating element, or as a plurality or series of heating elements distributed in the system. Alternatively, or additionally, the integrated temperature regulating unit may comprise one or more of:

a cooling element, and wherein said integrated temperature regulating unit is configured as a cooling element, or as a plurality or series of cooling elements distributed in the system. This embodiment is particularly advantageous for providing images of a sample during a plurality of different sample temperatures, such as wherein the sample is initially heated or cooled to a first temperature, after which it may be heated or cooled to a further plurality of subsequent target temperatures.

The invention may furthermore be advantageous for studying a point of interaction between two liquid samples at a first temperature and a second temperature, so as to further gain knowledge with respect to the interaction and possible reactions of two liquid samples, at different temperatures.

In an embodiment of the invention, the two samples interact at an initial steady state temperature, and images of a reaction between said first and second sample, within the LPSR, is obtained by the TEM instrument, during the heating phases and/or at one or more steady state temperatures.

In another preferred embodiment of the invention, the integrated temperature regulating unit is arranged for sufficient heating, and the thermal contact between the first part and the LPSR is dimensioned for facilitating that, at least a main portion of, said LPSR-during a steady state temperature situation—is at a substantially constant temperature. This embodiment is advantageous for obtaining images of a sample during a prolonged period of time or for obtaining images of a sample with a short half-life or reaction time, in which a specific temperature or fast temperature regulation is essential.

In another embodiment of the invention, the integrated temperature regulating unit has macroscopic dimensions, preferably in two or three dimensions, and the said thermal contact between said first part and said LPSR is provided by one, or more, thermal bridge(s) so as to provide a homogeneous temperature in a region with the temperature measuring unit and an imaging zone in the liquid compartment (LC), preferably within +/−0.1 K in steady state, in a region with the temperature measuring unit and an imaging zone in the liquid compartment (LC). Having an optional additional temperature sensor in/near the imaging region provides the capability of performing calorimetry on reactions in the liquid compartment and assessing direct sample temperature at high heating rates.

In the context of the present invention, homogenous is to be understood as a very low, or preferably non-existent temperature gradient when maintaining steady state temperature between the temperature of the sample and the temperature of liquid compartment and/or the LPSR, so as to ensure that a correct temperature of the sample is obtained, either by directly measuring the temperature of said sample or by measuring the temperature of either said liquid compartment or LPSR and wherein the temperature gradient between said sample and liquid compartment and/or LPSR are less than 1.0° C., preferably less than 0.5° C., more preferably less than 0.1° C., even more preferably less than 0.01° and most preferably less than 0.001° C.

This embodiment is particularly advantageous for a fast heat transfer between the liquid compartment and the sample, and furthermore advantageous for ensuring homogeneous temperature.

In a preferred embodiment of the invention, the distance between the liquid confinement in the LPSR and the integrated temperature regulating unit in the first part is of a macroscopic dimension, such as 0.1 mm or 0.5 mm, preferably at least 1 mm, more preferably at least 2 mm, or most preferably at least 5 mm.

This embodiment is particularly advantageous for improving stability of temperature regulation and steady state, i.e. to ensure homogeneous temperature distribution in the LPSR. The skilled person will understand that term macroscopic may interpreted as being visible by a human eye to a normal human being.

In another preferred embodiment of the invention, the second part of the LP-TEM holder further comprises one, or more, regions with a material providing relative thermal insulation, said region(s) being located adjacent to said first part and at a proximal end in the said second part, the opposite and distal end of the second part being arranged for physically supporting LP-TEM holder relative to the transmission electron microscopy (TEM) device during TEM imaging.

In yet another preferred embodiment of the invention, the first part of the LP-TEM holder further comprises one, or more, regions with a material providing relative thermal insulation, said region(s) being located adjacent to the second part and at a distal end in the first part.

In the context of the present invention, a material for providing relative thermal insulation is to be understood as a material suitable for insulating between two or more objects with a temperature gradient, reducing the thermal transfer between said two or more objects. The material may be selected from a solid polymer such as PEEK, a ceramic such as Macor, or materials and structures with grooves/holes/pores which may be any other type of material suitable for thermal insulation.

This embodiment of the invention is particularly advantageous for ensuring low thermal leak or dissipation between the first part of the LP-TEM holder in which the sample to be heated is positioned, and the second part of the holder, which does not need to be heated.

In an advantageous embodiment of the invention, the integrated temperature regulating unit comprises a plurality of heat sub-sources distributed in the first part, and/or in the LPSR, and/or in the second part. This embodiment is particularly advantageous for faster and more homogenous dispersion of heat throughout the first part of the LP-TEM holder.

In another advantageous embodiment of the invention, the plurality of heat sub-sources is distributed together with said thermal contact between said first part and/or in the second part, possibly also in said LPSR so as to increase and/or optimize a temperature rate of change in the LPSR, and thereby reduce the time and/or drift before a steady state temperature is reached in the LPSR.

This embodiment is particularly advantageous, as suitable heater distribution throughout the system providing heating power matching the steady state temperature profile and distribution of thermal mass, the steady state temperature profile can be quickly achieved and time with thermal drift minimized.

In yet another advantageous embodiment of the invention, the LPSR comprises two plane semiconductor elements clamped or bonded together to form a confined liquid compartment, each semiconductor element having a separate TEM window.

In a preferred embodiment of the invention, the LPSR is substantially planar in shape in an assembled configuration for TEM imaging.

In the context of the present invention, planar is to be understood as substantially flat and geometrically thin in the surface perpendicular to a TEM beam. The semiconductors may have a thickness typically in the range 50-500 μm. The window region may be of a semiconductor, semimetal, metal or insulating material such as silicon nitride, with from single atom layers e.g. in graphene, up to typically 50 nm in silicon nitride, but may be thicker if high pressures are wanted present in the system. Regions in the window may be locally thinned. This embodiment is particularly advantageous for decreasing scatter and noise within the image obtained by the TEM instrument, as the thinner structures enables a higher amount of electrons to pass through the sample, as opposed to passing through thicker elements. The liquid compartment and window regions may have composite layered structures, e.g. providing electrically conducting regions or electrically connected leads forming electrodes suitable for electrochemical control of processes on an insulating layer, or control of electroosmotic and electrophoretic effects in the system.

In another preferred embodiment of the invention, the first part of the LP-TEM holder has a receiving portion adapted for receiving and mechanically fixating said LPSR for assembly of the liquid phase transmission electron microscopy (LP-TEM) holder before TEM imaging, preferably said mechanical fixation being a releasable fixation of the LPSR. This embodiment is particularly advantageous for easy replacement of a sample, wherein images of two or more samples positioned within respective LPSRs needs to be obtained.

In another advantageous embodiment of the invention, the first part of the LP-TEM holder has one, or more, fluid channels being arranged for providing heating and/or cooling of the LPSR during TEM imaging, such as by a flow of heating/cooling fluid from an external system. This embodiment may be advantageous for providing a means of faster energy transfer for temperature regulation, than what is possible by using electric heating/cooling. This embodiment may be particularly advantageous for faster cooling, than what is possible by using means of electric cooling or a condensing and evaporation configuration. The fluid channels may be configured for providing a flow of a cooled liquid for rapid cooling of a sample within the liquid compartment, e.g. for cooling a sample at a rate of 1 to 50° C. per second or such as at a rate of 10 to 100° C. per second.

In another advantageous embodiment of the invention, the liquid compartment in the LPSR comprises one, or more, micro- and/or nano-channels for conduction of liquid substantially perpendicular to the electron beam for TEM imaging. This embodiment is particularly advantageous for imaging reactions between two or more samples, e.g. sample A and sample B, wherein sample A is different from sample B present at either end of the channel, or electrokinetic effects.

In the context of the present invention, micro and nano are to be understood, as channels with at least one dimension in the sub-micrometer range, or in some cases, reaching atomic scale, i.e. few- or sub-nanometer dimensions.

In yet another advantageous embodiment of the invention, the liquid compartment in the LPSR comprises one, or more, inlet channel(s) and one, or more, outlet channel(s), the LPSR being arranged for providing a streaming flow preferably a controlled/regulated flow, from said inlet channel(s) to said outlet channel(s) and TEM imaging at a position along the flow. This embodiment of the invention is particularly advantageous for providing TEM images of a sample, which either needs flow in order to reduce degradation due to radiolysis, or for providing a first and second sample, which upon mixing within the liquid compartment, provides a reaction to be examined by TEM imaging, or for mixing multiple fluids meeting at an intersection of several channels in or outside the imaging region.

In yet another advantageous embodiment of the invention, the channels are suspended nanochannels made primarily of silicon nitride or other suitable material. The geometry reduces bulging of said channels by their inner ambient pressure relative to the surrounding vacuum to a few nanometers, such as within 1 to 100 nanometers, such as tp within 2 to 50 nanometers or such as to within 3 to 20 nanometers at atmospheric pressure and the liquid layer thickness is defined during LPSR fabrication. This embodiment is advantageous for enabling to measure quantitative studies with well defined channel geometry. There may be regions with thinner liquid layers for improved imaging resolution, and the channel geometry may deviate from rectangular. Flow can be well controlled and have controlled and/or known Poiseuille flow profiles in the channel. Well defined mixing can be done, such as, but not limited by joining two channels to meet a third.

In the context of the present invention, bulging is to be understood both as outwards bulging driven by internal pressure, or inwards bulging by capillary forces and/or plastic deformation of the channels from such capillary forces. Inwards bulging can further reduce liquid layer thickness.

In yet another advantageous embodiment, the channels are parallel. This embodiment is particularly advantageous to reduce the effect of radiolytic damage, as said damage has less influence on separate nearby channels to ensure repeatability of TEM imaging in a series of individual channels with the same type of sample during an imaging session.

In the context of the present invention, radiolytic damage is to be understood as the chemical reactions inferred by the electron beam, during imaging, which may interfere with the sample and processes to be observed or degrade the channels and liquid flow e.g. by forming gas bubbles.

In a second aspect, the present invention relates to a transmission electron microscopy (TEM) system with a TEM sample holder according to the first aspect of the invention.

This aspect of the invention may be particularly advantageous for providing images of one or more samples, in which said sample(s) is/are heated and/or cooled a quickly and with a high precision. In an embodiment of the invention, the temperature regulating unit may heat or cool a sample at a rate of 10° C. per second, preferably at a rate of 20° C. per second, most preferably at a rate of 50° C. per second. The invention may furthermore be advantageous for maintaining a steady state temperature of +/−0.1° C., such as +/−0.01° C. or such as +/−0.001° C. of a sample during the image obtaining process.

The second aspect may furthermore be particularly advantageous for image obtaining over a longer time span, in which the steady state temperature of the sample is critical, such as maintaining a steady state target temperature of a sample for such as 2 hours, 10 hours or more preferably for days or weeks.

In a third aspect, the invention relates to a method for controlling a temperature of a TEM sample, the method comprising:

- providing a LP-TEM sample holder according to the first aspect of the invention,
- measuring a temperature in a liquid compartment and or in a part of a first holder,
- regulating a temperature of a sample to a target temperature value by providing heating and/or cooling to said sample with a temperature regulating unit and/or fluid channels.

This aspect of the invention may be particularly advantageous for providing images of one or more samples, in which said sample(s) is/are heated and/or cooled a quickly and with a high precision. In an embodiment of the invention, the temperature regulating unit may heat or cool a sample at a rate of 0.5° C. per second, preferably at a rate of 1° C. per second, most preferably at a rate of 10 to 20° C. per second. The invention may furthermore be advantageous for maintaining a steady state temperature of such as +/−0.1° C., preferably +/−0.01° C. or most preferably +/−0.001° C., of a sample during the image obtaining process.

The third aspect may furthermore be particularly advantageous for image obtaining over a longer time span, in which the steady state temperature of the sample is critical, such as maintaining a steady state target temperature of a sample for such as 2 hours, 10 hours or more preferably for days or weeks. In a fourth aspect, the invention relates to a method for providing TEM images of a TEM or liquid phase TEM sample during a steady-state temperature period of said sample, the method comprising:

- providing a LP-TEM sample holder according to the first aspect of the invention,
- measuring a temperature in a liquid compartment and or in a part of a first holder,
- regulating a temperature of a sample to a target temperature value by providing heating and/or cooling to said sample with a temperature regulating unit and/or fluid channels, and
- obtaining an image of said sample.

In a fifth aspect, the invention relates to a computer program product being adapted to enable a computer system comprising at least one computer having data storage means in connection therewith to perform the method according the third or fourth aspect of the invention.

The first, second, third, fourth and fifth aspect of the present invention may each be combined with any of the other aspects. These and other aspects of the invention will be apparent from and elucidated with reference to the embodiments described hereinafter.

BRIEF DESCRIPTION OF THE FIGURES

The liquid phase transmission electron microscopy (LP-TEM) holder according to the invention will now be described in more detail with regard to the accompanying figures. The figures show one way of implementing the present invention and is not to be construed as being limiting to other possible embodiments falling within the scope of the attached claim set.

DETAILED DESCRIPTION OF AN EMBODIMENT

Figure 1:
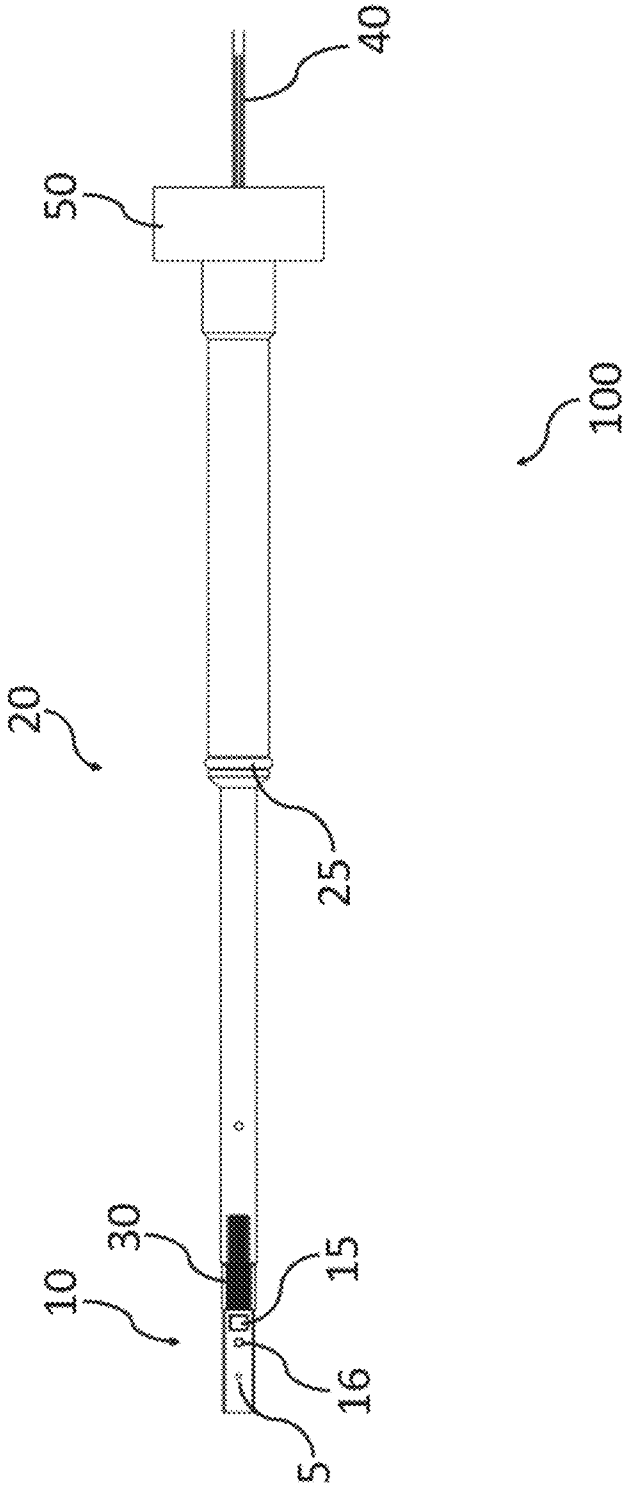
FIG. 1 shows a top-view of the LP-TEM holder, according to an embodiment of the invention.

FIG. 1 shows a top-view of the LP-TEM holder 100, with a first part 10, the first part 10 having a liquid phase sample receptacle (LPSR) 5, a temperature measuring unit 16, a temperature regulating unit 15 and an adjacent thermally insulating portion 30 being part of the second part 20. The first part 10 is attached to a second part 20, which is configured to support the first part 10 and connecting the first part 10 to an external portion 50, which are outside of the TEM instrument (not shown), when the LP-TEM holder 100 is inserted into said TEM instrument. The thermally insulating portion 30 is positioned so as to prevent thermal energy provided from the temperature regulating unit 15, to dissipate into the second part 20. The second part is further provided with a sealing portion 25, which connects to a peripheral wall (not shown) of the TEM instrument, when the LP-TEM holder 100 is inserted into said TEM instrument. The LP-TEM holder 100 has channels 40, extending from the first part 10, through the second part 20 and external portion, which provides electric and/or fluidic connection between an outside environment and to the first part 10, so as to enable temperature regulation of the temperature regulating unit 15, provide data from the temperature measuring unit 16 and optionally for transferring liquids and/or electrical/data signals to/from the LPSR 5. In another embodiment, the channels 40 of the LT-TEM holder are positioned in an alternative manner, such as perpendicular to the longitudinal axis.

Figure 2:
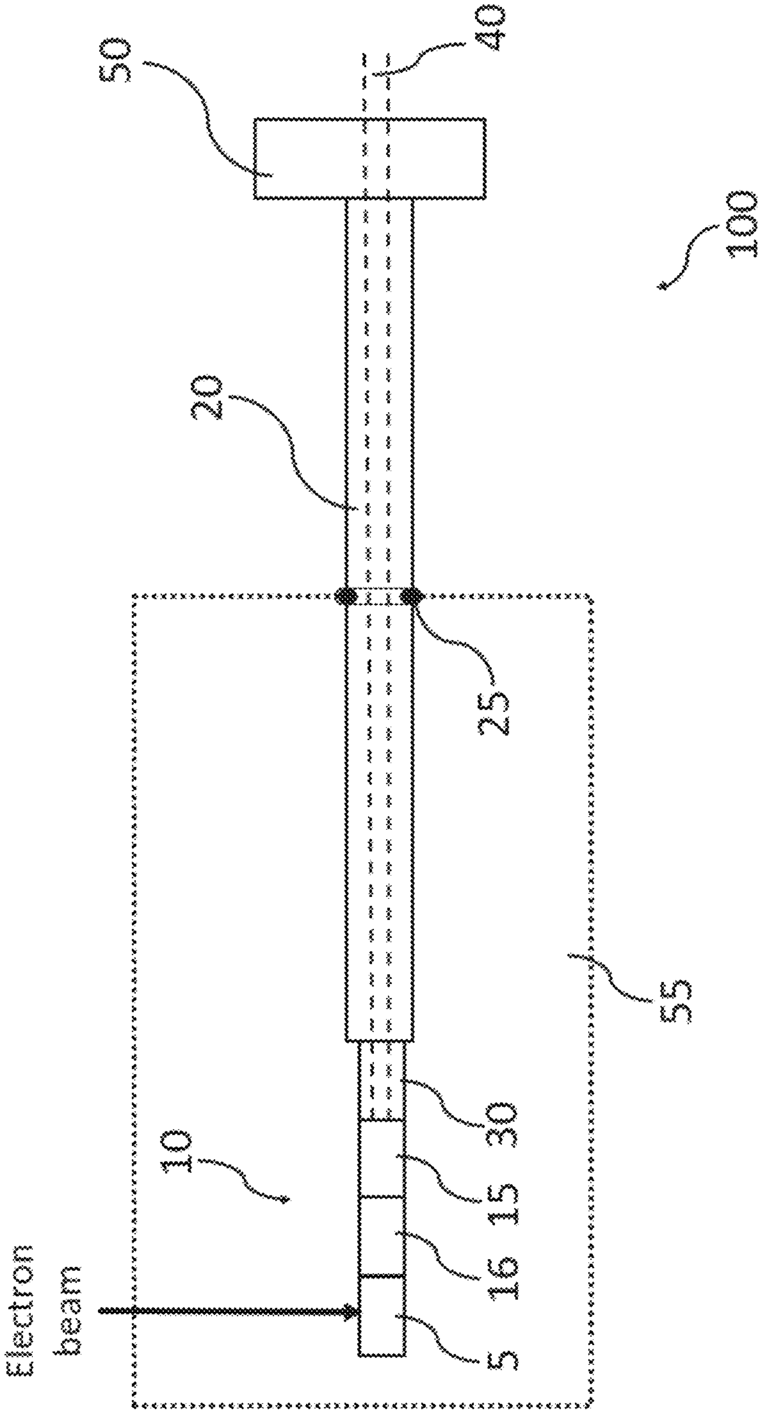
FIG. 2 shows a longitudinal cross-section of the LP-TEM holder, according to an embodiment of the invention.

FIG. 2 shows a longitudinal cross-section of the LP-TEM holder 100, with a first part 10, the first part 10 having a LPSR 5, a temperature measuring unit 16, a temperature regulating unit 15 and an adjacent thermally insulating portion 30. The first part 10 is attached to a second part 20, which is configured to support the first part 10 and connecting the first part 10 to an external portion 50, which are outside of the TEM instrument (not shown), when the LP-TEM holder 100 is inserted into said TEM instrument. When the LP-TEM holder 100 is inserted into a TEM instrument, the LPSR 5 is positioned so as to enable an electron beam from the TEM instrument to be sent through said LPSR 5. The thermally insulating portion 30 is positioned so as to prevent thermal energy provided from the temperature regulating unit 15, to dissipate into the second part 20. The second part is further provided with a sealing portion 25 which connects to a peripheral wall (not shown) of the TEM instrument, when the LP-TEM holder 100 is inserted into said TEM instrument. The sealing portion 25 provides an air-sealed cavity 55. The LP-TEM holder 100 has channels 40 in the longitudinal axis, extending from the first part 10, through the second part 20 and external portion, which provides electric and/or fluidic connection between an outside environment and to the first part 10, so as to enable temperature regulation of the temperature regulating unit 15, provide data from the temperature measuring unit 16 and optionally for transferring liquids and/or electrical/data signals to/from the LPSR 5. In another embodiment, the channels 40 of the LT-TEM holder are positioned in an alternative manner, such as perpendicular to the longitudinal axis.

In an advantageous embodiment of the invention, the air within the air-sealed cavity 55, and internal voids in the whole system can be evacuated so as to provide a sub-atmospheric pressure or vacuum, for further reducing any thermal dissipation between the parts and tubes, ensuring a steady-state temperature within the LPSR 5, as well as maintaining vacuum in the TEM.

In another embodiment of the invention, the thermally insulating portion 30 may be positioned on the second part 20 of the LP-TEM holder 100. However, from a practical point of view, the thermally insulating portion 30, or just for short thermal insulation 30, may also be considered to form part of the first part 10, because the thermally insulating portion 30 is positioned between the first part 10 and the second part 20.

Figure 3A:
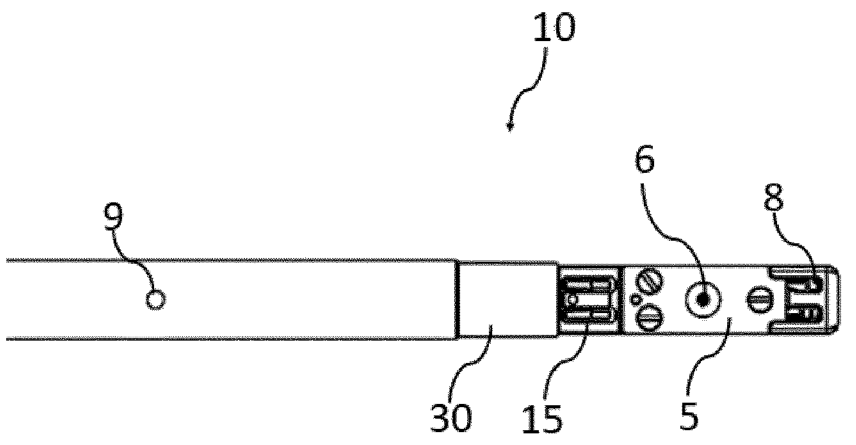
FIGS. 3A, 3B and 3C shows three views of a section of the first part of the LP-TEM holder, according to an embodiment of the invention.

FIG. 3A shows a top-view of a section of the first part 10, said first part 10 having an LPSR 5, a temperature regulating unit 15, a printed circuit 8 enabling electrical connections to the LPSR for electrochemical and electrokinetic control and measurements in the liquid sample, an air-lock pin 9 and an adjacent thermally insulating portion 30. The thermally insulating portion 30 is positioned so as to prevent thermal energy provided from the temperature regulating unit 15, to dissipate into the second part 20 (not shown). In the LPSR 5, a TEM window 6 is positioned, enabling for an electron beam from a TEM instrument (not shown) to beam through the LPSR 5.

Figure 3B:
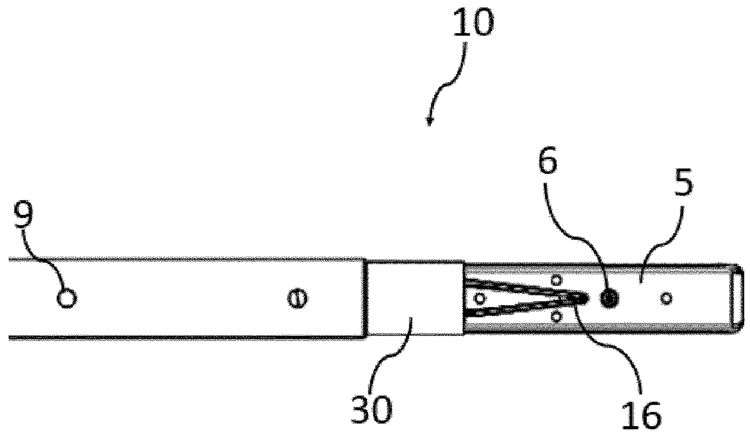

FIG. 3B shows a bottom-view of a section of the first part 10, said first part 10 having an LPSR 5, an air-lock pin 9, a temperature measuring unit 16 and a adjacent thermally insulating portion 30. In this particular embodiment, the temperature measurement unit 16 is a thermocouple, connected to the temperature regulating unit 15 (not shown) and the printed circuit (8) not shown.

In the LPSR 5, a TEM window 6 is positioned, enabling for an electron beam from a TEM instrument (not shown) to beam through the LPSR 5.

Figure 3C:
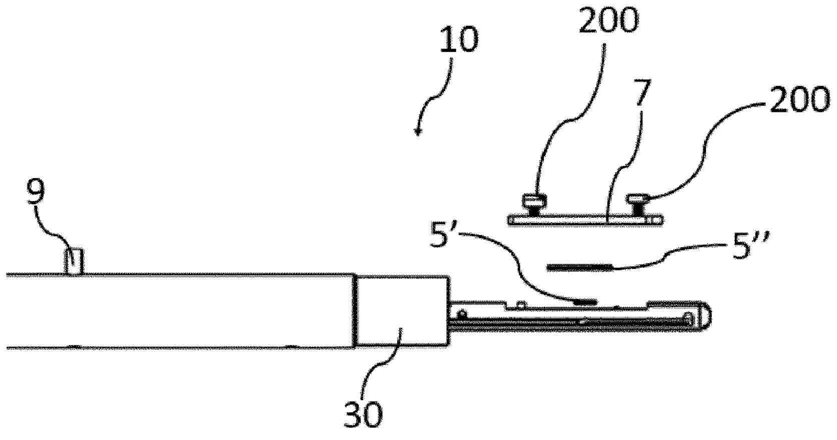

FIG. 3C shows a side-view of a section of the first part 10 of the LP-TEM holder wherein the LPSR, comprising two chips 5', 5", optionally bonded, is mounted below a top-lid 7, which is fixated with screws 200, to the first part 10. The first part 10 furthermore comprises air-lock pin 9 and a thermally insulating portion 30. The thermally insulating portion 30 is positioned so as to prevent thermal energy provided from the temperature regulating unit 15 (not shown), to dissipate into the second part 20 (not shown).

Figure 4:
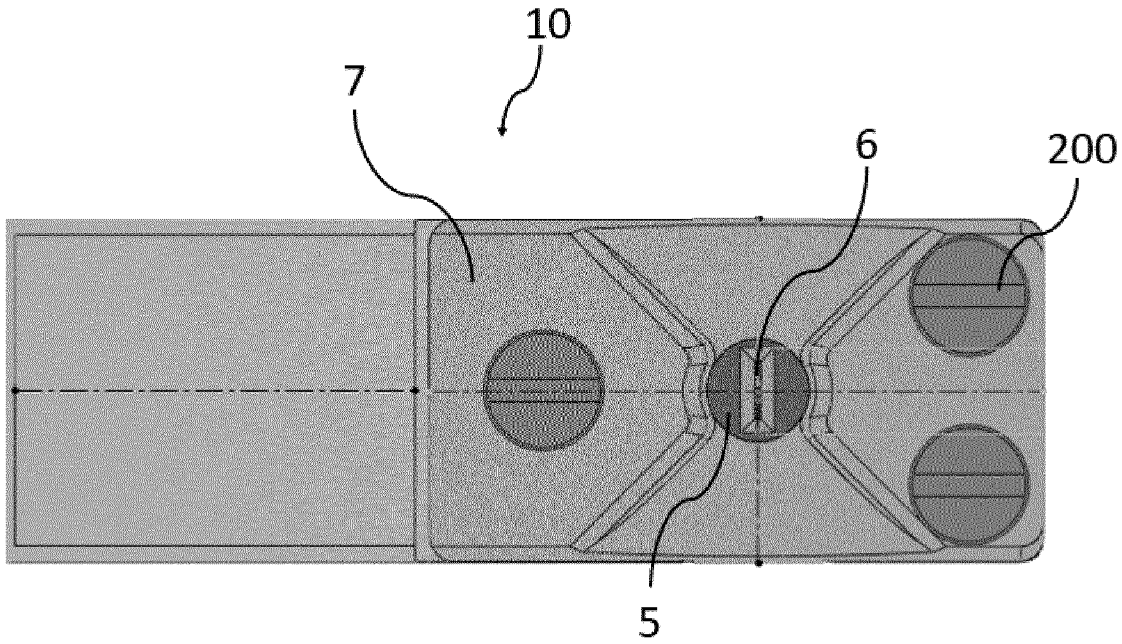
FIG. 4 shows a top-view of a section of the first part of the LP-TEM holder, according to an embodiment of the invention.

FIG. 4 shows a top-view of a section of the first part 10 of the LP-TEM holder wherein the LPSR 5 is mounted below a top-lid 7, which are fixated with three screws 200, to the first part 10. In the centre of the LPSR 5, a TEM window 6 is positioned, enabling for an electron beam from a TEM instrument (not shown) to beam through the LPSR 5.

Figure 5:
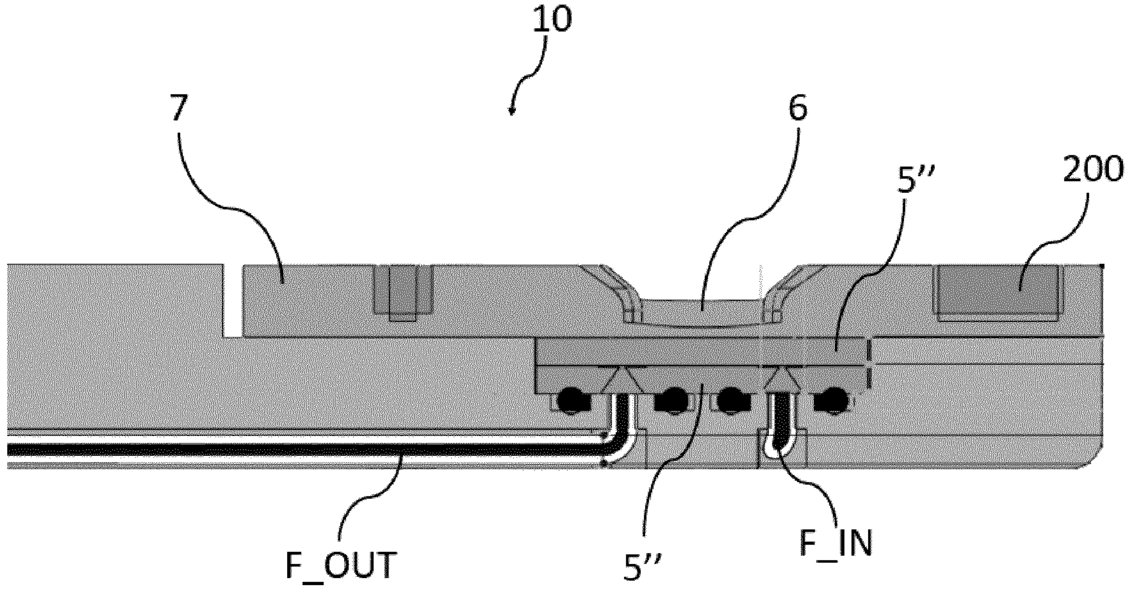
FIG. 5 shows a side-view of a section of the first part of the LP-TEM holder, according to an embodiment of the invention.

FIG. 5 shows a side-view of a section of the first part 10 of the LP-TEM holder wherein the LPSR, comprising two bonded wafers 5', 5" is mounted below a top-lid 7, which are fixated with screws 200, to the first part 10. In the centre of the LPSR 5', 5" a TEM window 6 is positioned, enabling for an electron beam from a TEM instrument (not shown) to beam through the LPSR 5', 5". The first part 10, is configured with two fluidic channels F_IN, F_OUT for providing fluid flow to the LPSR 5', 5".

Figure 6:
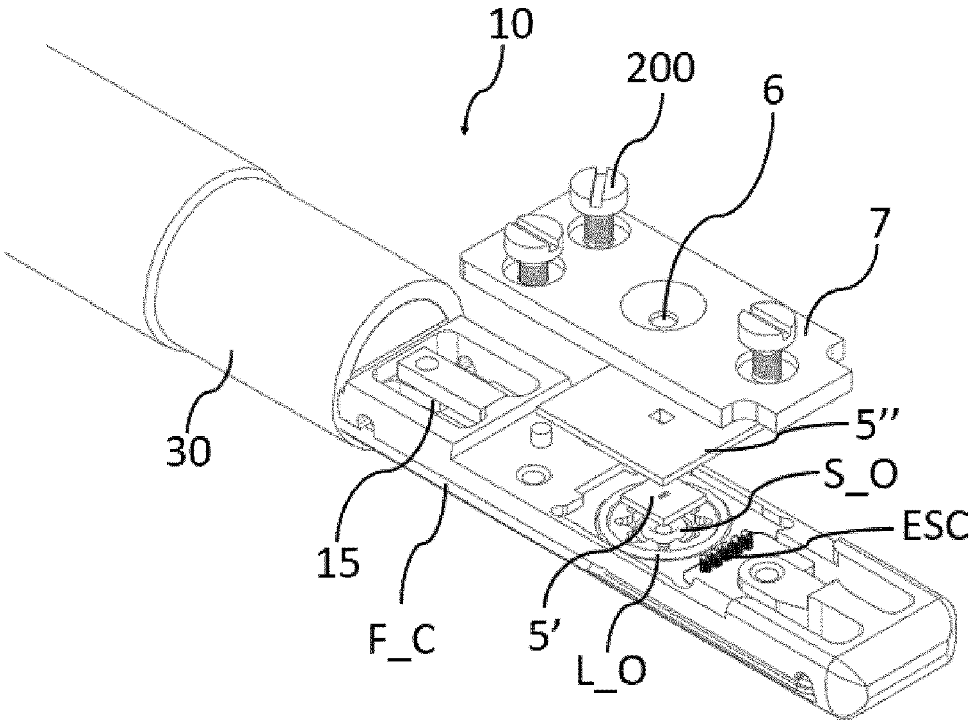
FIG. 6 shows a trimetric view of a section of the first part 10, of the LP-TEM holder, according to an embodiment of the invention.

FIG. 6 shows a trimetric view of a section of the first part 10, of the LP-TEM holder wherein the LPSR, comprising two (optionally bonded) chips 5', 5" is mounted below a top-lid 7, which are fixated with screws 200, to the first part 10. In the centre of the LPSR 5', 5" a TEM window 6 is positioned, enabling for an electron beam from a TEM instrument (not shown) to beam through the LPSR 5', 5". The first part 10, is configured with a fluid channel F_C for providing fluid flow to the LPSR 5', 5". In this embodiment of the invention, the fluid channel F_C is a PEEK tube. At the perimeter of the TEM window 6, a small o-ring S_O and a large o-ring L_O are positioned, to maintain the fluid within the LPSR 5', 5", when providing fluid from the fluid channel F_C. To provide electrical connections to measure temperature locally, or to control electrokinetic and/or electrochemical processes in the LPRS 5', 5", when inserted in the LP-TEM holder, an electric spring contact ESC is positioned distal to the TEM window 6. The first part 10 furthermore comprises an adjacent thermally insulating portion 30, though the portion 30 could also be a part of the second part 20 as explained above. The thermally insulating portion 30 is positioned, so as to prevent thermal energy provided from the temperature regulating unit 15, to dissipate into the second part 20 (not shown).

Figure 7:
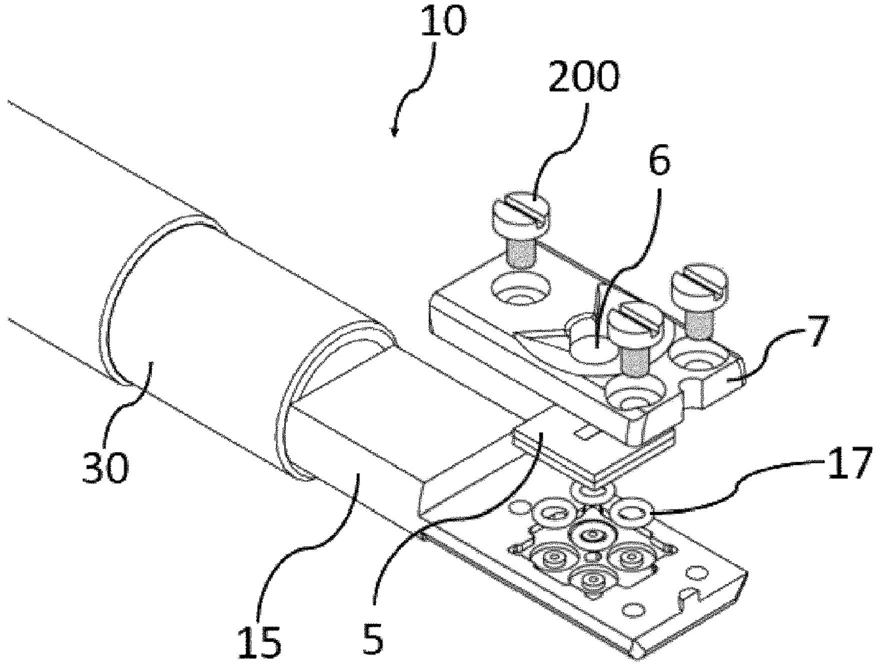
FIG. 7 shows a trimetric view of a section of the first part 10, of the LP-TEM holder, according to an alternative embodiment of the invention.

FIG. 7 shows a trimetric view of a section of the first part 10, of the LP-TEM holder, according to an alternative embodiment of the invention, wherein the LPSR 5 is mounted below a top-lid 7, which are fixated with screws 200, to the first part 10. In the centre of the LPSR 5 a TEM window 6 is positioned, enabling for an electron beam from a TEM instrument (not shown) to pass the beam through the LPSR 5. In this embodiment of the invention, the perimeter of the TEM window 6, is surrounded by four o-rings 17, to maintain the fluid within the LPSR 5, when providing fluid from the fluid channel (not shown). The first part 10 furthermore comprises an adjacent thermally insulating portion 30. The thermally insulating portion 30 is positioned, so as to prevent thermal energy provided from the temperature regulating unit 15, to dissipate into the second part 20 (not shown). In another embodiment of the invention, the top-lid 7 may be fixated with other means than screws 200, such as clamps, snap-on lock, magnetic lock or other suitable fixating means.

Figure 8:
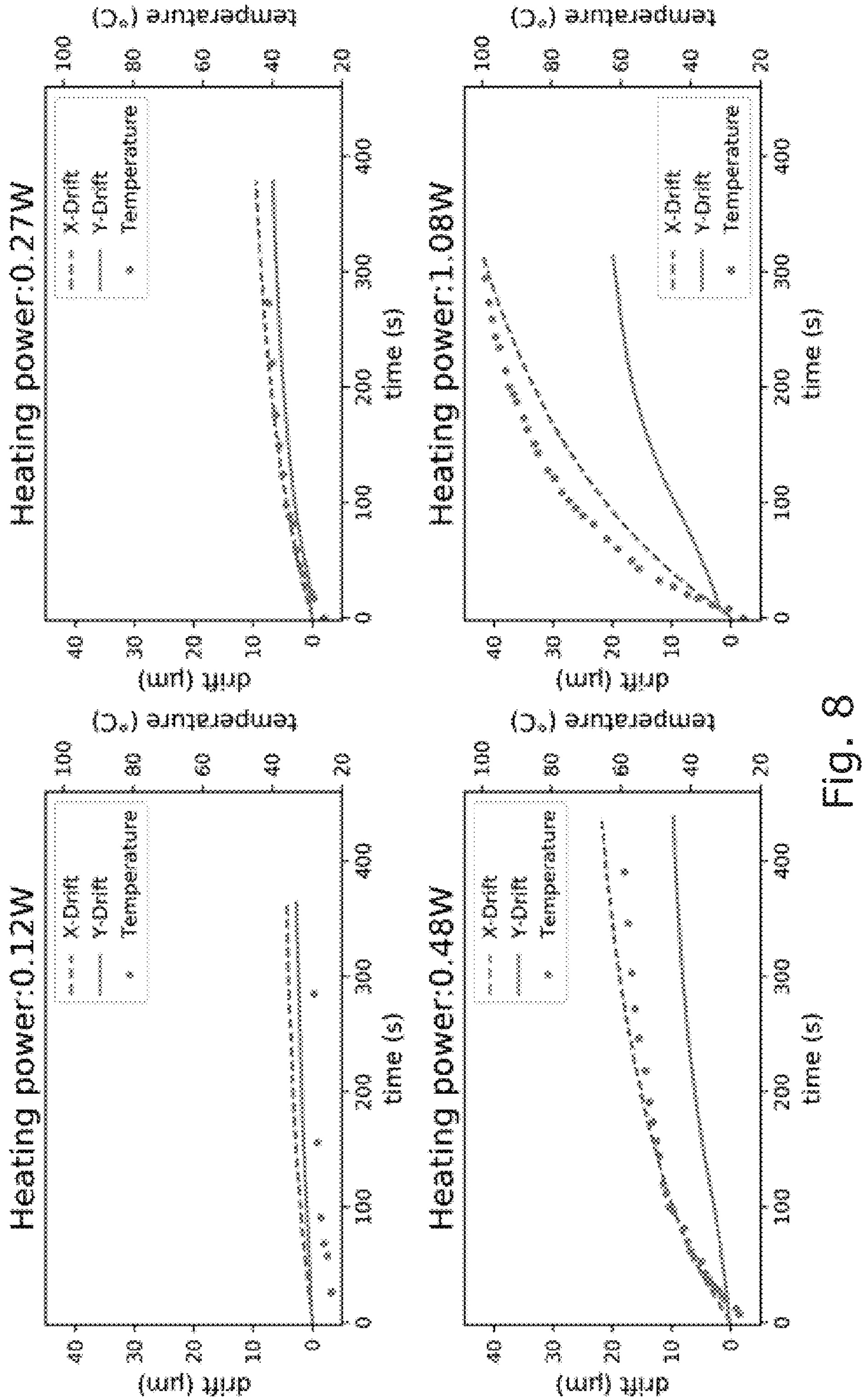
FIG. 8 shows four graphs representing temperature drift within the first part of the LP-TEM holder as measured on a fix point in the imaging region.

FIG. 8 shows four graphs representing temperature drift within the imaging region of the first part of the LP-TEM holder, in two spatial axis' (x-drift and y-drift) and wherein the x-axis of the graphs represents time in seconds and the y-axis represents temperature of the sample within the LPSR and micrometers (μm) of drift of temperature. The upper left graph shows temperature drift at an applied heating power of 0.12 W, the upper right graph shows temperature drift at an applied heating power of 0.27 W, the lower left graph shows temperature drift at an applied heating power of 0.48 W and the lower right graph shows temperature drift at an applied heating power of 1.08 W.

Figure 9:
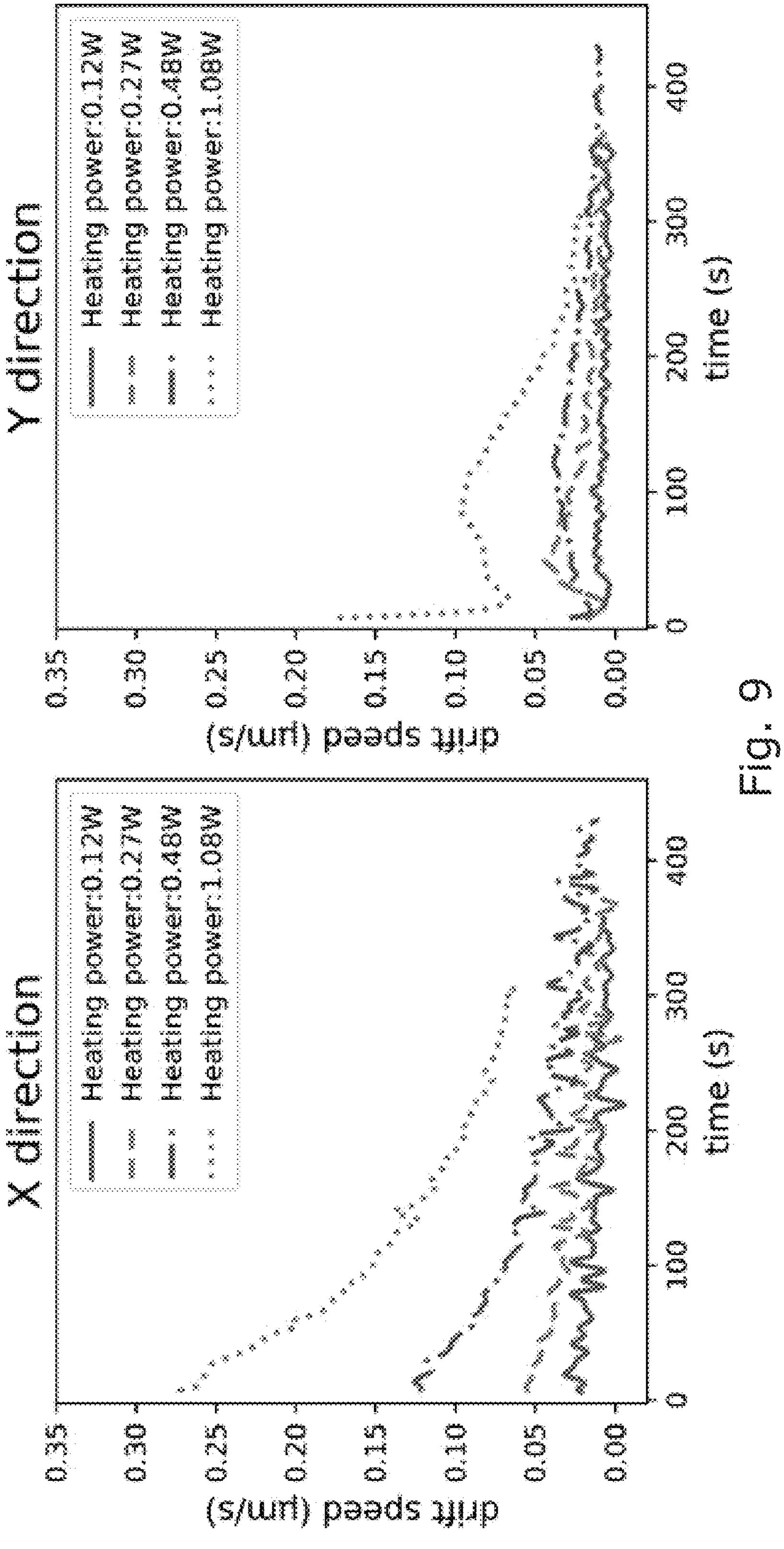
FIG. 9 shows two graphs representing temperature drift speed at different rates of heating power, within the first part of the LP-TEM holder as measured on a fix point in the imaging region.

FIG. 9 shows two graphs representing temperature drift speed at different rates of heating power, within the imaging region of the first part of the LP-TEM holder, wherein the x-axis of the graphs represents time in seconds and the y-axis represents rate of temperature drift in micrometers per second (μm/s) within the first part. The left graph shows the temperature drift in a first spatial axis along the holders longitudinal direction (x direction) and the right graph shows the temperature drift in a second spatial axis transverse to the longitudinal direction and the beam (y direction).

Figure 10:
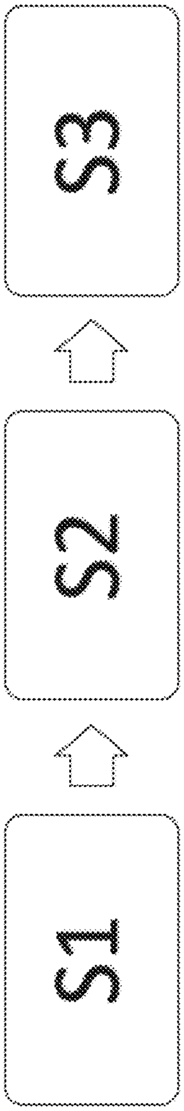
FIG. 10 is a flow-chart of a method according to a method embodiment of the invention.

FIG. 10 is a flow-chart of a method according to a method embodiment of the invention. The flow-chart is a method embodiment for controlling a temperature of a TEM sample, the method comprising:

- S1—providing a LP-TEM sample holder according to the first aspect of the invention,
- S2—measuring a temperature in a liquid compartment and or in a part of a first holder, and
- S3—regulating a temperature of a sample to a target temperature value by providing heating or cooling to said sample with the temperature regulating unit and/or the fluid channels.

It is to be understood that the method of controlling the temperature and the above steps may be repeated in a loop, such as with a PID feedback loop, to reach a target temperature and/or maintain a steady state temperature.

To summarize, the present invention relates to a liquid phase transmission electron microscopy (LP-TEM) holder with integrated temperature regulation for operating with an associated transmission electron microscopy instrument providing an electron beam for imaging, the LP-TEM holder comprising a liquid phase sample receptacle (LPSR) which may be made from two or more layers of parts of wafers, the LPSR providing a liquid compartment. The LP-TEM holder furthermore comprises an integrated temperature regulating unit 15, capable of regulating the temperature of the LPSR and liquid in the liquid compartment by means of a temperature measuring unit 16 capable of measuring a temperature in said liquid compartment. The LPSR is thermally isolated with a thermal isolating portion, with respect to an external environment and associated devices. The invention is particularly advantageous for providing fast temperature regulation and accurate steady state temperatures of one or more fluids to be imaged.

Annex of Items

In particular, the present invention may relate to the below numbered list of Items, and any combinations thereof:

Item 1. A liquid phase transmission electron microscopy LP-TEM holder (100) with integrated temperature regulation for operating with an associated transmission electron microscopy TEM instrument providing an electron beam for imaging, the LP-TEM holder comprising:

a liquid phase sample receptacle LPSR, (5) comprising:

a liquid compartment (LC) for receiving an associated liquid sample for TEM imaging, an upper and an lower TEM window, wherein the electron beam-during TEM imaging-enters the upper TEM window, propagates through said liquid sample, and exits the lower TEM window, a first part (10) for mechanically fixating and supporting said LPSR during TEM imaging, the first part comprising an integrated temperature regulating unit (15), preferably a heat source, capable of regulating the temperature of, the LPSR via thermal contact between said first part and said LPSR, a temperature measuring unit (16) capable of measuring a temperature in said liquid compartment, and/or in said first part, and arranged for outputting a corresponding signal (S_T) indicative of the temperature (T_LC) in the liquid compartment, and a second part (20) for physically supporting the first part relative to the transmission electron microscopy (TEM) instrument, the second part further comprising thermal insulation (30) for containing thermal energy from said integrated temperature regulating unit with respect to the LPSR, wherein the LPSR is arranged for being heated and/or cooled from said integrated temperature regulating unit in the first part during TEM imaging, and the temperature of the LPSR is controllable by adjusting the temperature regulation unit according to said signal (S_T) from the temperature measuring unit indicative of the temperature in the liquid compartment.

2. The LP-TEM holder according to Item 1, wherein the integrated temperature regulating unit comprises one or more of:

a heating element a cooling element, and wherein said integrated temperature regulating unit is configured as a heating element and a cooling element, or as a plurality or series of heating elements and cooling elements distributed in the system.

3. The LP-TEM holder according to Item 1 or 2, wherein the integrated temperature regulating unit is arranged for sufficient heating, and the thermal contact between the first part and the LPSR is dimensioned for facilitating that, at least a main portion of, said LPSR (5)—during a steady state temperature situation—is at a substantially constant temperature.

4. The LP-TEM holder according to any of Items 1 to 3, wherein the integrated temperature regulating unit has macroscopic dimensions, preferably in two or three dimensions, and the said thermal contact between said first part and said LPSR is provided by one, or more, thermal bridge(s) so as to provide a homogeneous temperature, preferably within +/−0.1 K in steady state, in a region with the temperature measuring unit and an imaging zone in the liquid compartment (LC).

5. The LP-TEM holder according to any of the proceeding Items, wherein the distance between the liquid confinement in the LPSR and the integrated temperature regulating unit in the first part is of a macroscopic dimension, preferably at least 1 mm, more preferably at least 2 mm, or most preferably at least 5 mm.

6. The LP-TEM holder according to any of the proceeding Item, wherein the second part further comprises one, or more, regions with a material providing relative thermal insulation, said region(s) being located adjacent to said first part and at a proximal end in the said second part, the opposite and distal end of the second part being arranged for physically supporting LP-TEM holder relative to the transmission electron microscopy (TEM) device during TEM imaging.
7. The LP-TEM holder according to any of the proceeding Items, wherein the integrated temperature regulating unit (15) comprises a plurality of heat sub-sources distributed in the first part, and/or in the LPSR, optionally also in the second part (20).
8. The LP-TEM holder according to Item 7, wherein the plurality of heat sub-sources is distributed together with said thermal contact between said first part and said LPSR so as to increase a temperature rate of change in the LPSR, and thereby reduce the time before a steady state temperature is reached in the LPSR.
9. The LP-TEM holder according to any of the proceeding Item, wherein the LPSR comprises two plane semiconductor elements clamped or bonded together to form a confined liquid compartment, each semiconductor element having a separate TEM window.
10. The LP-TEM holder according to any of the proceeding Item, wherein the first part has a receiving portion adapted for receiving and mechanically fixating said LPSR for assembly of the liquid phase transmission electron microscopy (LP-TEM) holder before TEM imaging, preferably said mechanical fixation being a releasable fixation of the LPSR.
11. The LP-TEM holder according to any of the proceeding Items, wherein the liquid compartment (LC) in the LPSR comprises one or more, channels for conduction of liquid substantially perpendicular to the electron beam for TEM imaging, the channels preferably being of sub-micrometer height.
12. The LP-TEM holder according to any of the proceeding Items, wherein the liquid compartment (LC) in the LPSR comprises one, or more, inlet channel(s) and one, or more, outlet channel(s), the LPSR being arranged for providing a streaming flow from said inlet channel(s) to said outlet channel(s) and TEM imaging at a position along the flow.

Item 13. A transmission electron microscopy (TEM) system with a TEM sample holder according to any of Items 1 to 12.

Item 14. A method for controlling a temperature of a TEM sample, the method comprising:
- providing a LP-TEM sample holder according to any of Items 1 to 12,
- measuring a temperature in a liquid compartment and or in a part of a first holder according to Item 1, and
- regulating a temperature of a sample to a target temperature value by providing heating or cooling to said sample with the temperature regulating unit of Item 1 or 2.

Item 15. A computer program product being adapted to enable a computer system comprising at least one computer having data storage means in connection therewith to perform the method according to Item 14.

Although the present invention has been described in connection with the specified embodiments, it should not be construed as being in any way limited to the presented examples. The scope of the present invention is set out by the accompanying claim set. In the context of the claims, the terms “comprising” or “comprises” do not exclude other possible elements or steps. Also, the mentioning of references such as “a” or “an” etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A liquid phase transmission electron microscopy LP-TEM holder with integrated temperature regulation for operating with an associated transmission electron microscopy TEM instrument providing an electron beam for imaging, the LP-TEM holder comprising:
- a liquid phase sample receptacle LPSR, comprising:
  - a liquid compartment (LC) for receiving an associated liquid sample for TEM imaging,
  - an upper and a lower TEM window, wherein the electron beam-during TEM imaging-enters the upper TEM window, propagates through said liquid sample, and exits the lower TEM window,
- a first part for mechanically fixating and supporting said LPSR during TEM imaging, the first part comprising an integrated temperature regulating unit capable of regulating the temperature of, the LPSR via thermal contact between said first part and said LPSR,
- a temperature measuring unit capable of measuring a temperature in said liquid compartment, and/or in said first part, and arranged for outputting a corresponding signal (S_T) indicative of the temperature (T_LC) in the liquid compartment, and
- a second part for physically supporting the first part relative to the transmission electron microscopy (TEM) instrument, the second part further comprising thermal insulation for containing thermal energy from said integrated temperature regulating unit with respect to the LPSR, wherein the LPSR is arranged for being heated and/or cooled from said integrated temperature regulating unit in the first part during TEM imaging, and the temperature of the LPSR is controllable by adjusting the temperature regulation unit according to said signal (S_T) from the temperature measuring unit indicative of the temperature in the liquid compartment.

2. The LP-TEM holder according to claim 1, wherein the integrated temperature regulating unit comprises one or more of:
- a heating element, wherein said integrated temperature regulating unit is configured as a heating element, or as a plurality or series of heating elements distributed in the system.

3. The LP-TEM holder according to claim 1, wherein the integrated temperature regulating unit comprises one or more of:
- a cooling element, and wherein said integrated temperature regulating unit is configured as a cooling element, or as a plurality or series of cooling elements distributed in the system.

4. The LP-TEM holder according to claim 1, wherein the integrated temperature regulating unit is arranged for heating, and the thermal contact between the first part and the LPSR is dimensioned for facilitating that, at least a main portion of, said LPSR—during a steady state temperature situation—is at a substantially constant temperature, within +/−0.1 K in steady state, in a region with the temperature measuring unit and an imaging zone in the liquid compartment (LC).

5. The LP-TEM holder according to claim 1, wherein the integrated temperature regulating unit has macroscopic dimensions, and the said thermal contact between said first part and said LPSR is provided by one, or more, thermal bridge(s) so as to provide a homogeneous temperature in a region with the temperature measuring unit and an imaging zone in the liquid compartment (LC).

6. The LP-TEM holder according to claim 1, wherein the distance between the liquid confinement in the LPSR and the integrated temperature regulating unit in the first part is of a macroscopic dimension.

7. The LP-TEM holder according to claim 1, wherein the second part further comprises one, or more, regions with a material providing relative thermal insulation, said region(s) being located adjacent to said first part and at a proximal end in the said second part, the opposite and distal end of the second part being arranged for physically supporting LP-TEM holder relative to the transmission electron microscopy (TEM) device during TEM imaging.

8. The LP-TEM holder according to claim 1, wherein the integrated temperature regulating unit comprises a plurality of heat sub-sources distributed in the first part and/or in the LPSR.

9. The LP-TEM holder according to claim 8, wherein the plurality of heat sub-sources is distributed together with said thermal contact between said first part and said LPSR so as to increase and/or optimize a temperature rate of change in the LPSR, and thereby reduce the time and/or drift before a steady state temperature is reached in the LPSR.

10. The LP-TEM holder according to claim 1, wherein the LPSR comprises two plane semiconductor elements clamped or bonded together to form a confined liquid compartment, each semiconductor element having a separate TEM window.

11. The LP-TEM holder according to claim 1, wherein the first part has a receiving portion adapted for receiving and mechanically fixating said LPSR for assembly of the liquid phase transmission electron microscopy (LP-TEM) holder before TEM imaging.

12. The LP-TEM holder according to claim 1, wherein the liquid compartment (LC) in the LPSR comprises one or more, channels for conduction of liquid substantially perpendicular to the electron beam for TEM imaging.

13. The LP-TEM holder according claim 1, wherein the liquid compartment (LC) in the LPSR comprises one, or more, inlet channel(s) and one, or more, outlet channel(s), the LPSR being arranged for providing a streaming flow from said inlet channel(s) to said outlet channel(s) and TEM imaging at a position along the flow.

14. A transmission electron microscopy (TEM) system with a TEM sample holder according to claim 1.

15. A method for controlling a temperature of a TEM sample, the method comprising:

providing a LP-TEM sample holder according to claim 1, measuring a temperature in a liquid compartment and or in a part of a first holder according to claim 1, and regulating a temperature of a sample to a target temperature value by providing heating or cooling to said sample with the temperature regulating unit of claim 1.

16. A computer program product being adapted to enable a computer system comprising at least one computer having data storage means in connection therewith to perform the method according to claim 15.

* * * * *